(12) United States Patent
Roberts

(10) Patent No.: US 6,175,671 B1
(45) Date of Patent: Jan. 16, 2001

(54) PHOTONIC CRYSTAL WAVEGUIDE ARRAYS

(75) Inventor: Kim Byron Roberts, Nepean (CA)

(73) Assignee: Nortel Networks Limited, Montreal (CA)

(*) Notice: Under 35 U.S.C. 154(b), the term of this patent shall be extended for 0 days.

(21) Appl. No.: 09/165,053

(22) Filed: Oct. 1, 1998

(51) Int. Cl.$^7$ .................................................. G02B 6/12

(52) U.S. Cl. .............................. 385/14; 385/27; 385/39; 385/47; 385/129; 359/177; 359/337

(58) Field of Search ................................. 385/129–132, 385/14, 24, 27, 37, 39, 40, 45–47; 359/176, 177, 179, 194, 333, 337

(56) References Cited

U.S. PATENT DOCUMENTS

| | | | |
|---|---|---|---|
| 4,786,130 | * 11/1988 | Georgiou et al. | 385/48 |
| 5,389,943 | 2/1995 | Brommer | 343/909 |
| 5,418,868 | * 5/1995 | Cohen et al. | 385/16 |
| 5,513,029 | 4/1996 | Roberts | 359/177 |
| 5,526,449 | * 6/1996 | Meade et al. | 385/14 |
| 5,651,818 | 7/1997 | Milstein | 117/54 |
| 5,684,817 | * 11/1997 | Houdre et al. | 372/45 |
| 5,748,057 | * 5/1998 | De Los Santos | 333/134 |
| 5,784,400 | 7/1998 | Joannopoulos | 372/96 |
| 5,973,823 | * 10/1999 | Koops et al. | 359/322 |
| 6,016,374 | * 1/2000 | Adams et al. | 385/24 |

OTHER PUBLICATIONS

H. Kosaka et al., "Superprism Phenomena in Photonic Crystals: Toward Microscale Lightwave Circuits," J. Lightwave Technology, vol. 17, No. 11, pp. 2032–2038, Nov. 1999.*

Dragone, IEEE Photon. Technology Letters, Sep. 1991, pp. 812 to 815.

Joannopoulos et al, Photonic Crystals, Molding the Flow of Light, Chapter 5, "Two–Dimensional Photonic Crystals", 1995 (No Month).

* cited by examiner

Primary Examiner—Rodney Bovernick
Assistant Examiner—Michael J. Stahl
(74) Attorney, Agent, or Firm—Lee, Mann, Smith, McWilliams, Sweeney & Ohlson

(57) ABSTRACT

A waveguide device for optical signals in an optical communication system relies upon photonic bandgap material to guide the optical signal via a plurality of pathways. A two-dimensional photonic bandgap material is formed in a planar slab of dielectric medium by a two-dimensional lattice in which discontinuities in the lattice region define waveguides. A waveguide array formed in the device allows multiple Mach-Zehnder interferometer devices to be constructed including small radius turns without significant losses. An optical signal equalizer formed of such a device relies upon the transfer function defined by a multiple arm Mach-Zehnder having arms of different length. By applying controlled modulation to propagation through the arms, an adaptive equalizer is formed. The adaptive equalizer has application in correcting gain tilt in line amplifiers of optical communications systems. The method of applying equalization may include measurement of the spectrum of the output optical signal and providing feedback to control the transfer function applied by the adaptive equalizer.

20 Claims, 14 Drawing Sheets

FORMATION OF WAVEGUIDE FROM DEFECTS IN LATTICE

DIELECTRIC SLAB

FORMATION OF LATTICE SITES AS CYLINDERS OF DIELECTRIC MEDIUM

Fig 4   TWO ARM MACH ZEHNDER INTERFEROMETER USED AS AN OPTICAL FILTER HAVING FIXED PROPERTIES
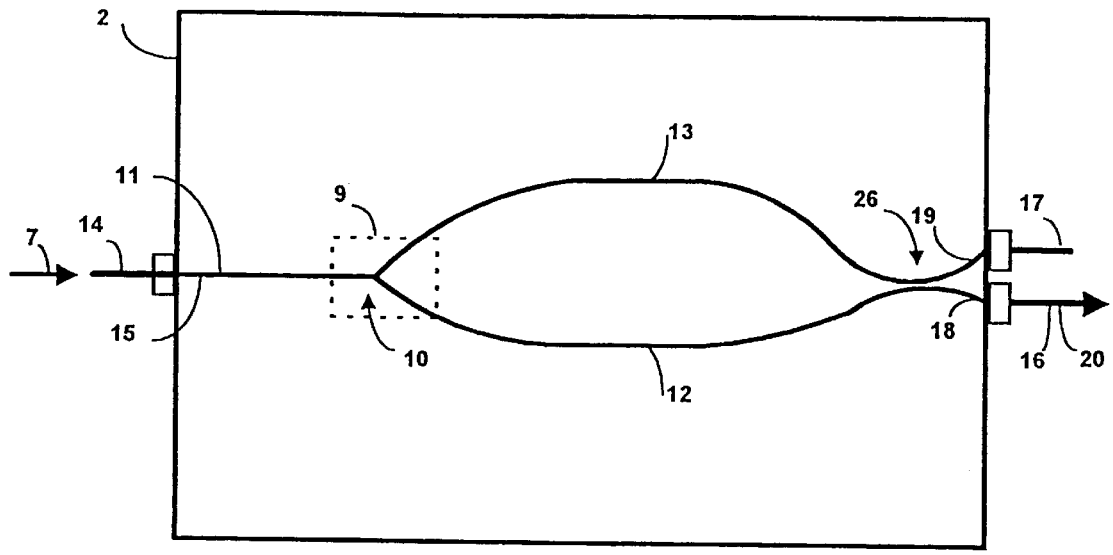
Fig 6   MACH ZEHNDER INTERFEROMETER USED AS AN ADAPTIVE OPTICAL FILTER
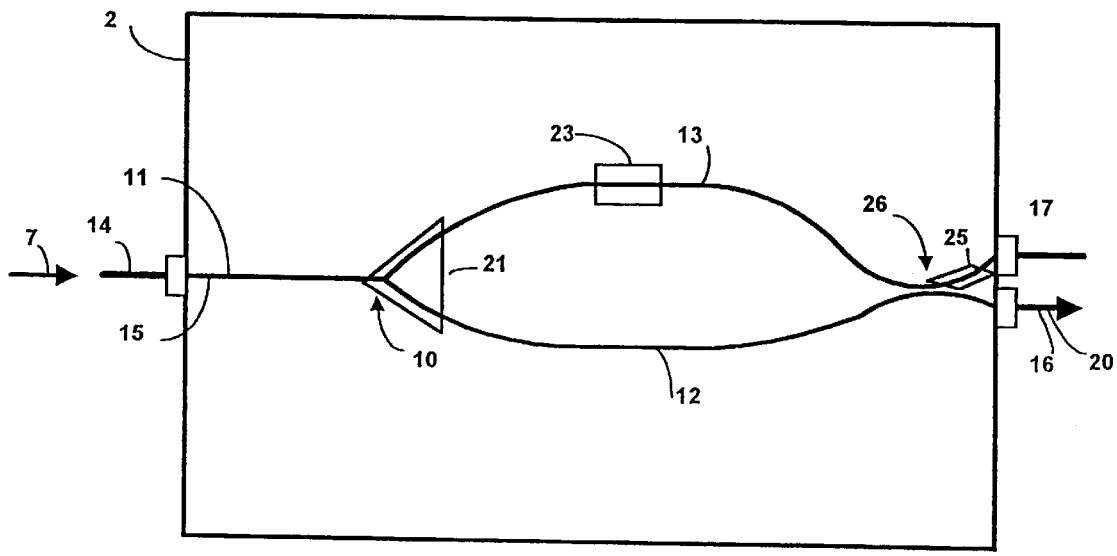

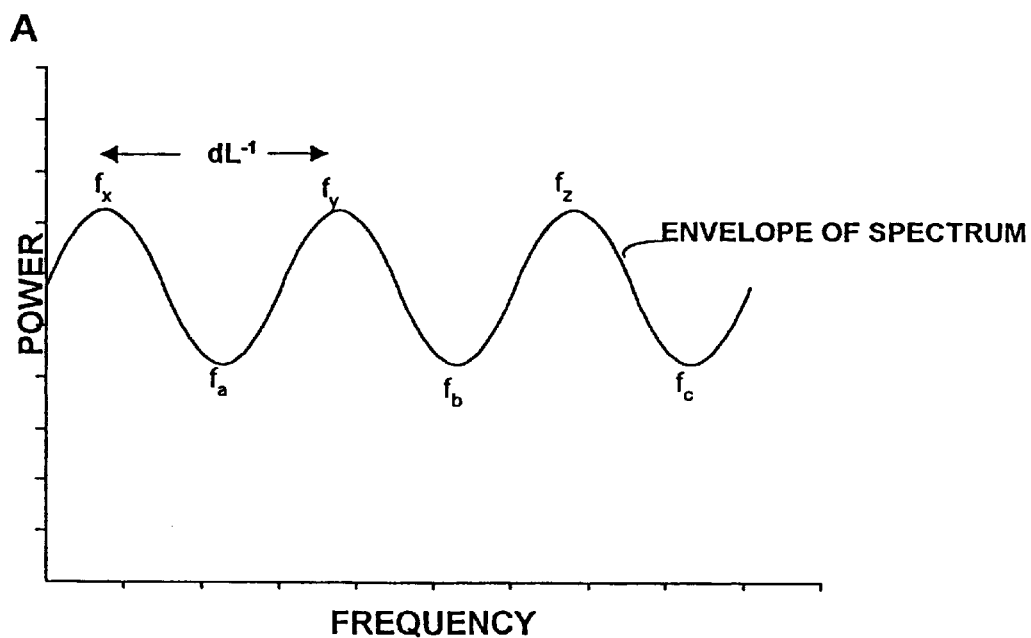

FORMATION OF WAVEGUIDE FROM DISCONTINUITIES
IN LATTICE AND ACTIVE CONTROL OF Y JUNCTION

MODULATOR FORMED IN A WAVEGUIDE FOR VARYING OPTICAL PATH LENGTH

Fig 9     3 DB COUPLER WITH OUTPUT FROM ONE ARM CONTROLLED
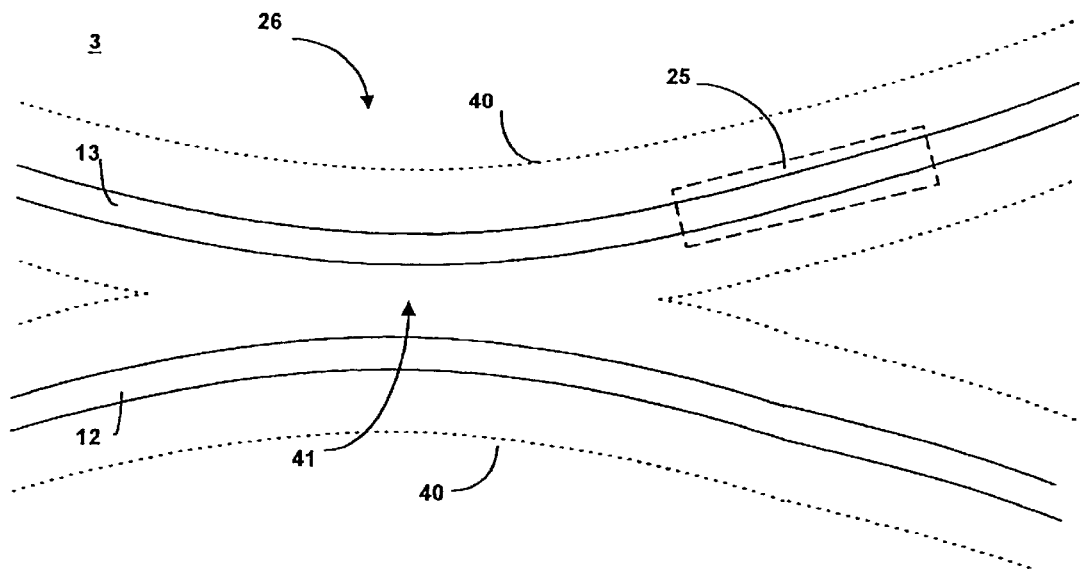
Fig 10     CONTROL OF TRANSMISSION BY LATTICE SITES WITHIN WAVEGUIDE
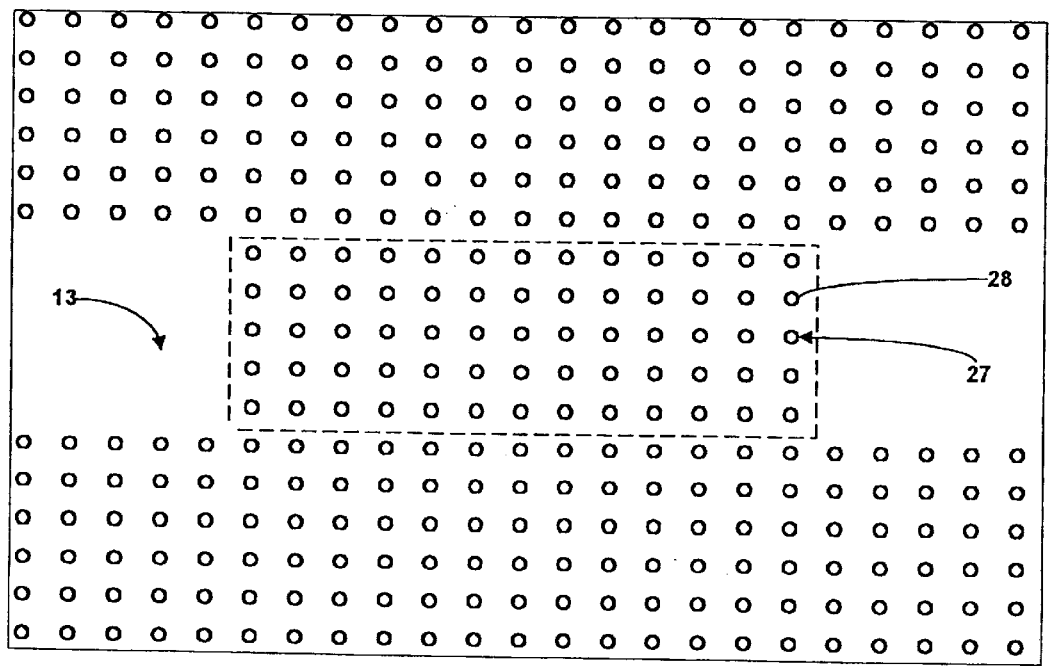

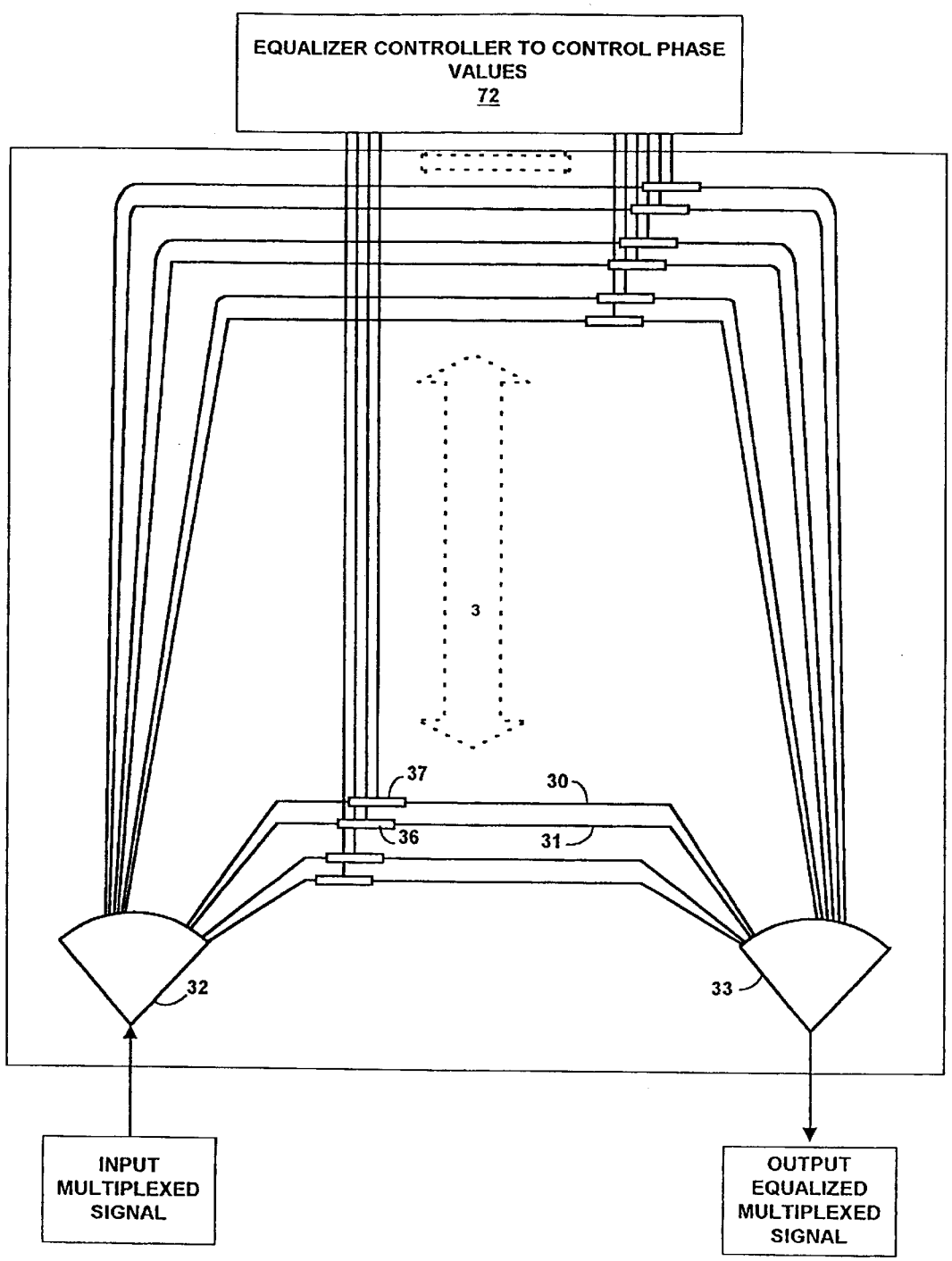
FIG 11   OPTICAL EQUALIZER FORMED AS MULTIPLE WAVEGUIDE ARRAY IN A PHOTONIC CRYSTAL EFFECT OF MULTIPLE ARM MACH ZEHNDER
INTERFEROMETER - PARALLEL WAVEGUIDE ARRAY FOR
FREQUENCY RESPONSE SYNTHESIS

SYNTHESISED TRANSFER FUNCTION

Fig 15  PHOTONIC CRYSTAL DEVICE WITH MULTIPLE PATHWAYS FORMED BY REFLECTION

Fig 16 PHOTONIC CRYSTAL DEVICE WITH MULTIPLE PATHWAYS FORMED BY REFLECTION AND INCLUDING MODULATORS

Fig 18    SURFACE WAVE PROPAGATION AND SCATTERING FROM CONTROLLED LATTICE SITES
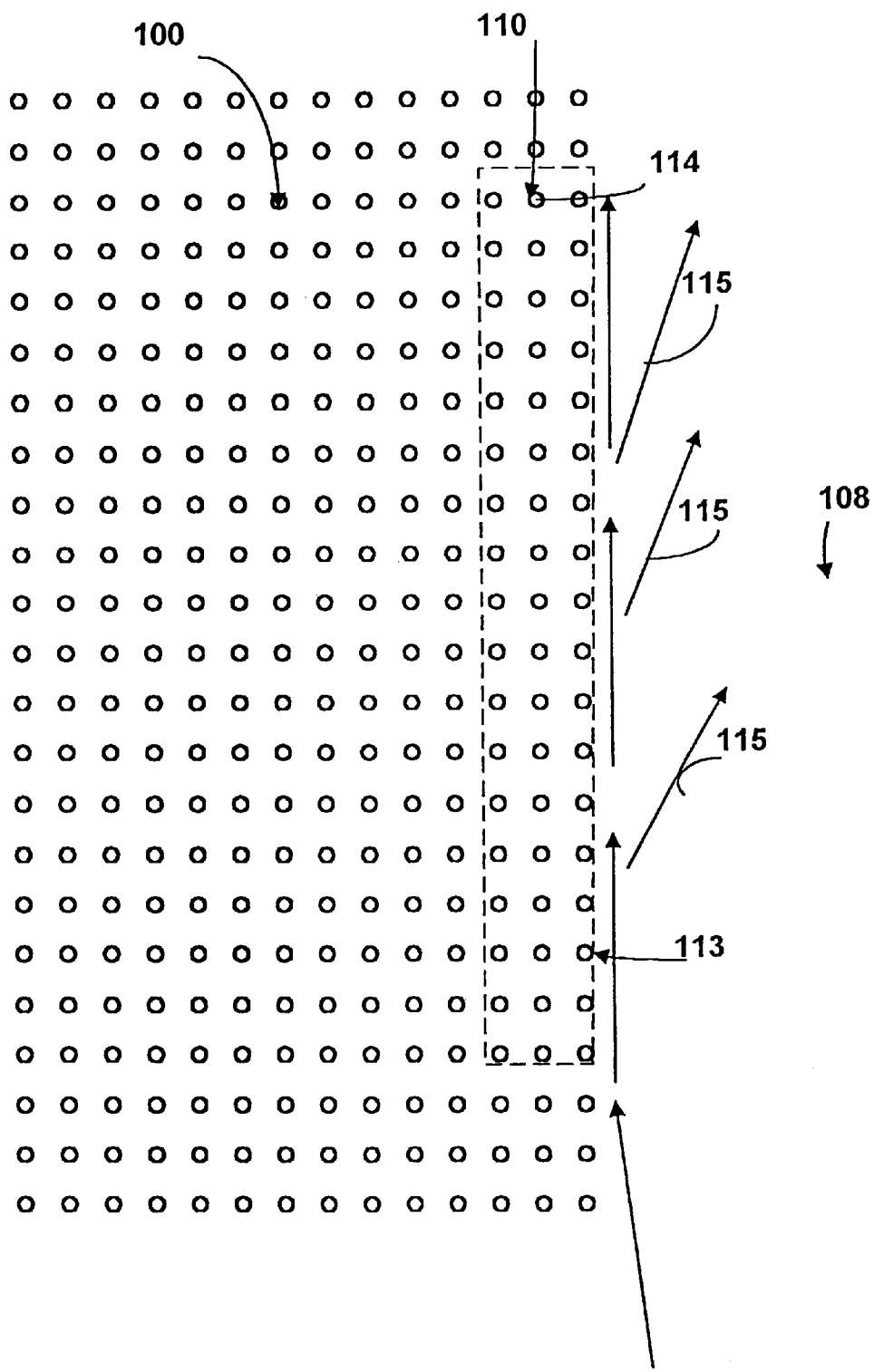

PHOTONIC CRYSTAL WAVEGUIDE ARRAYS

PHOTONIC CRYSTAL WAVEGUIDE ARRAYS

This invention relates to devices and systems incorporating waveguide arrays, methods of use of such devices and systems, and methods of manufacture thereof, and in particular but not exclusively to such devices for use in the equalization of optical signals in an optical communications system.

BACKGROUND OF THE INVENTION

Planar structures comprising waveguide arrays such as multiple arm Mach Zehnder interferometers and simple two-arm interferometers have been used in various devices for processing optical signals. Waveguide arrays in such devices may for example be constructed using silica on silicon technology in which waveguides are defined by doped silica regions which have a higher refractive index than a surrounding cladding layer of germanium doped silica.

Arrays with large numbers of waveguides of different length formed using such structures have been proposed to provide filtering of optical signals, as for example disclosed by Dragone, IEEE Photon Technology Letters, September 1991, pp 812–815.

The inventor of the present invention has also disclosed in a co-pending application entitled "Optical Equalizer", the contents of which are incorporated herein by reference, an adaptive optical equalizer using an array of controlled waveguides to provide a transfer function which is synthesized by a Fourier analysis technique in order to achieve a desired characteristic of equalization between components in a wavelength division multiplexed optical signal.

The feasibility of such a waveguide array device to achieve adaptive equalization presents difficulties of manufacture using silica on silicon technology since, for example, reliance upon total internal reflection as the method of guidance means that the bend radius of waveguides must be sufficiently large to avoid excessive losses whereas the overall size of the planar structure is limited. A further difficulty is that of providing adequate means of controlling transmission parameters within waveguides. It has been proposed to use heating strips to locally vary the temperature of the waveguide material, thereby providing controlled adjustment of optical path length. The response time of such temperature control may not be adequate in some applications. There remains a need to provide an improved waveguide structure in such devices to facilitate manufacture and improve control.

A particular area of interest is the control of optical power levels in optical communications system to obtain optimum performance, the power level being required to be sufficient to establish a signal to noise ratio which will provide an acceptable bit error rate but without the power level exceeding a level at which limiting factors such as the onset of non-linear effects result in degradation of the signal. In wavelength division multiplexed transmission it is desirable to maintain each of the power levels of the individual wavelengths components at substantially the same level.

The inventor has disclosed in U.S. Pat. No. 5,513,029 a method of monitoring component power levels in WDM transmission using orthogonal low frequency dither signals and controlling component signal power to maintain optical performance.

It is also known from GB 2314714A that an imbalance of component signal powers in a WDM transmission is likely to occur at an optical amplifier stage, as used to boost signal power at stages in a long distance transmission utilising optical amplifiers such as erbium doped fibre amplifiers. Such amplifiers have a non-uniform gain characteristic as a function of wavelength which is variable in dependence upon the amplifier gain, this change in gain characteristic consequent on change of gain being commonly referred to as dynamic gain tilt.

There is therefore a need to provide optical filtering which is adaptive and which can be used in conjunction with optical amplifiers in order to maintain a preferred spectral profile of an optical signal.

It is known from J. D. Joannopoulous et al, Photonic Crystals: Moulding the Flow of Light, published 1995 by Princeton University Press, in Chapter 5, to provide two-dimensional photonic crystals within a planar slab of dielectric medium which exhibits a photonic band gap whereby the medium is non-transmissive to an optical signal within a defined frequency range for directions of propagation co-planar with the slab of dielectric medium. The slab is sandwiched between parallel slabs of material having lower refractive index to contain the optical signal by internal reflection. The photonic crystal is formed by providing in the planar slab of dielectric medium a lattice formed by lattice sites at which the dielectric properties of the medium are varied relative to the bulk properties of the dielectric medium such that a latticed region is formed which is essentially opaque to the optical signal and a waveguide region may then be formed by discontinuities in the periodic lattice, for example by omitting a contiguous set of lattice sites. The optical signal is therefore constrained to propagate through the waveguide region.

An advantage of such structures is that the waveguides may have a very small turn radius of the order of several wavelengths of the optical signal which compares favourably with a typical turn radius of the order of several centimeters which would be required for traditional core-cladding waveguides describes above which rely upon total internal reflection.

U.S. Pat. No. 5,651,818, Milstein et al, discusses in the introduction thereby a number of available techniques of manufacturing photonic band gap materials.

U.S. Pat. No. 5,784,400, Joannopoulous et al, proposes to utilise two-dimensional photonic band gap materials in an optical device in the form of a resonant cavity.

It is known from U.S. Pat. No. 5,389,943, Brommer et al, to utilise the frequency selective transmission properties of such two-dimensional photonic band gap materials in a filter in which transmitted light is modified in frequency response by the optical transmission characteristics of the bulk properties of the material. Further disclosed is the active control of material forming the lattice sites, such as by the application of an external field, in order to modify the refractive index of material at the sites and thereby actively control the transmissive properties of the filter.

SUMMARY OF THE INVENTION

It is an object of the present invention to provide an improved device having an array of waveguides for an optical signal.

It is a further object of the present invention to provide an improved method of manufacture of such devices for providing multiple waveguide structures.

It is a further object of the present invention to provide an improved optical equalization device for use in optical communications systems.

According to the present invention there is disclosed a waveguide device for an optical signal comprising;
a slab of dielectric medium;
a latticed region formed in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough; and
a waveguide region formed in the dielectric medium by discontinuities in the periodic array of lattice sites allowing propagation of the signal therethrough;
wherein the waveguide region defines an input region for the input of the optical signal, an output region for the output of the optical signal and a plurality of optical pathways for conducting respective components of the optical signal between the input and output regions.

According to a further aspect of the present invention there is disclosed a method of forming a waveguide device for an optical signal comprising;
forming a slab of dielectric medium;
forming a latticed region in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough; and
forming a waveguide region in the dielectric medium by discontinuities in the periodic array of lattice sites allowing propagation of the signal therethrough;
wherein the waveguide region defines an input region for the input of the optical signal, an output region for the output of the optical signal and a plurality of optical pathways for conducting respective components of the optical signal between the input and output regions.

According to a further aspect of the present invention there is disclosed a method of applying equalization to an optical signal comprising the steps of;
inputting the optical signal to an input region of a waveguide device;
conducting components of the optical signal to an output region of the waveguide device via a plurality of respective optical pathways defined by the waveguide device; and
outputting the optical signal from the output region;
wherein the step of conducting the components of the optical signal comprises inhibiting propagation of the optical signal through a latticed region formed by a periodic array of lattice sites defining a photonic bandgap and propagating the components of the optical signal via a waveguide region formed by discontinuities in the periodic array of lattice sites.

According to a further aspect of the present invention there is disclosed a method of dividing an optical signal into a plurality of components for conduction via respective waveguides comprising the steps of:
inputting the optical signal into a waveguide region defined by discontinuities in a latticed region in which propagation is inhibited by a photonic band gap;
directing the optical signal into grazing incidence with a linearly extending surface defined by a transition between the latticed region and the waveguide region so that surface wave propagation of the optical signal occurs in proximity with the linearly extending surface;
deflecting portions of the surface wave by scattering from the linearly extending surface; and
conducting the deflected portions into said waveguides.

Preferred embodiments of the present invention will now be described by way of example only and with reference to the accompanying drawings.

BRIEF DESCRIPTION OF THE DRAWINGS

FIG. 4 illustrates schematically a photonic crystal device in the form of a two-arm Mach-Zehnder interferometer providing an optical filter having fixed properties;

FIG. 5 illustrates graphically the frequency response of, the filter of FIG. 4;

FIG. 6 illustrates a Mach-Zehnder interferometer used as an adaptive optical filter by controlling elements of a photonic crystal;

Figure 3:
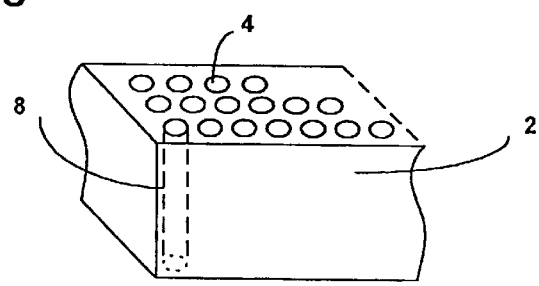
FIG. 3 illustrates in greater detail the formation of lattice sites as cylinders of dielectric medium in the slab of FIG. 2.
Figure 12:
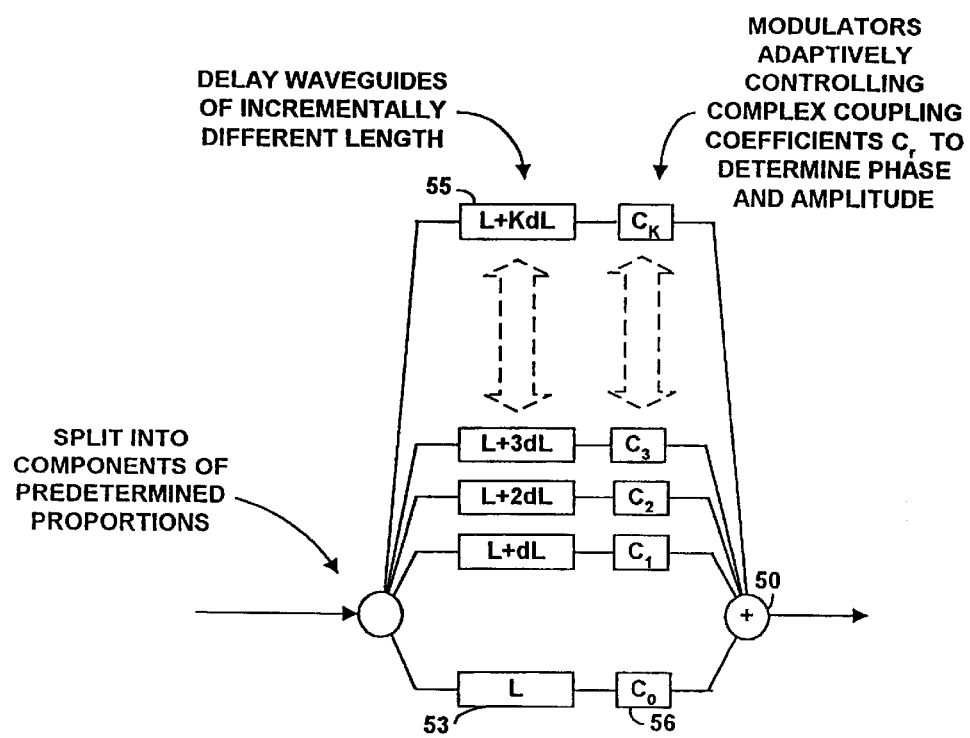
Figure 14:
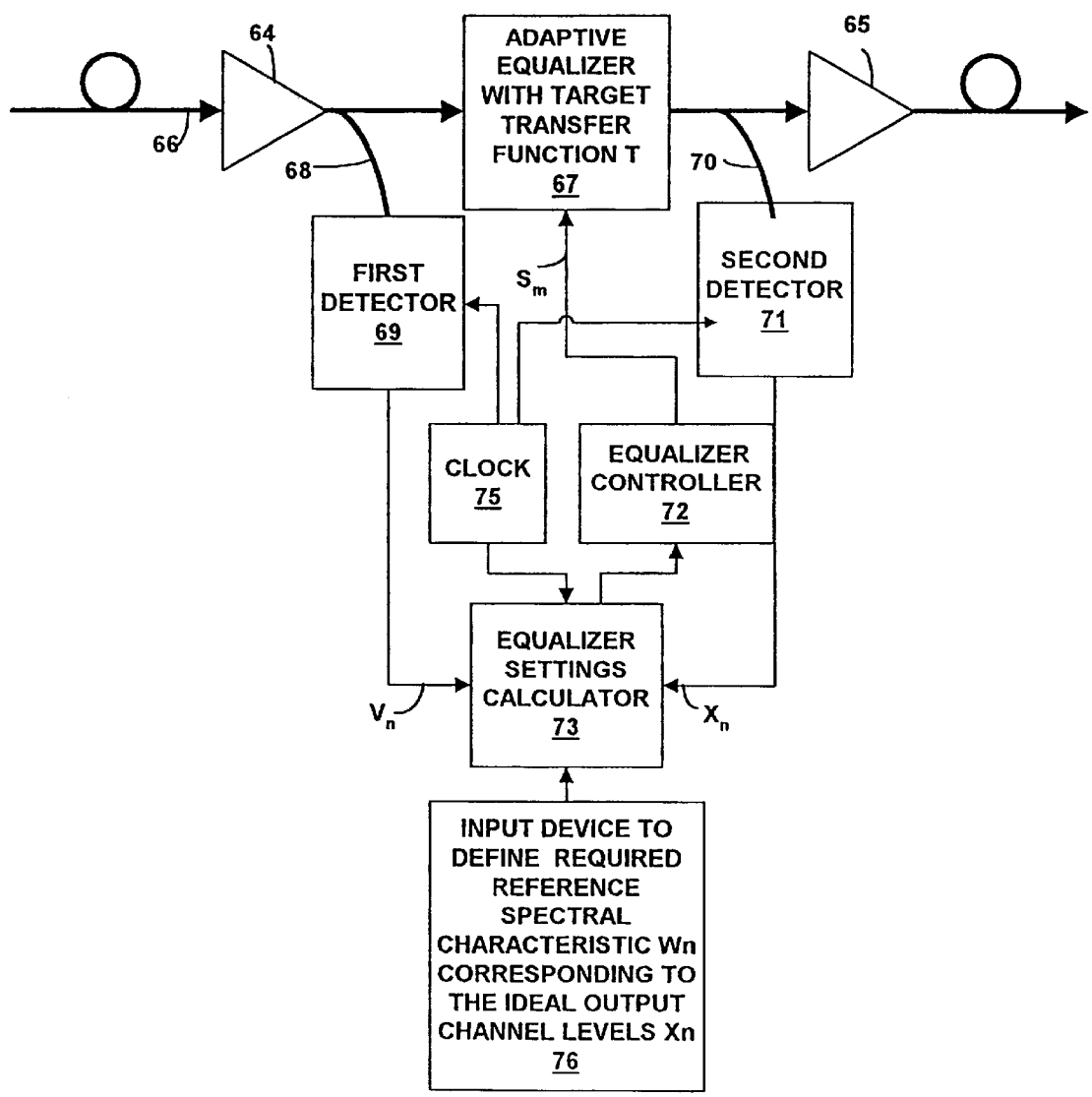
Figure 15:
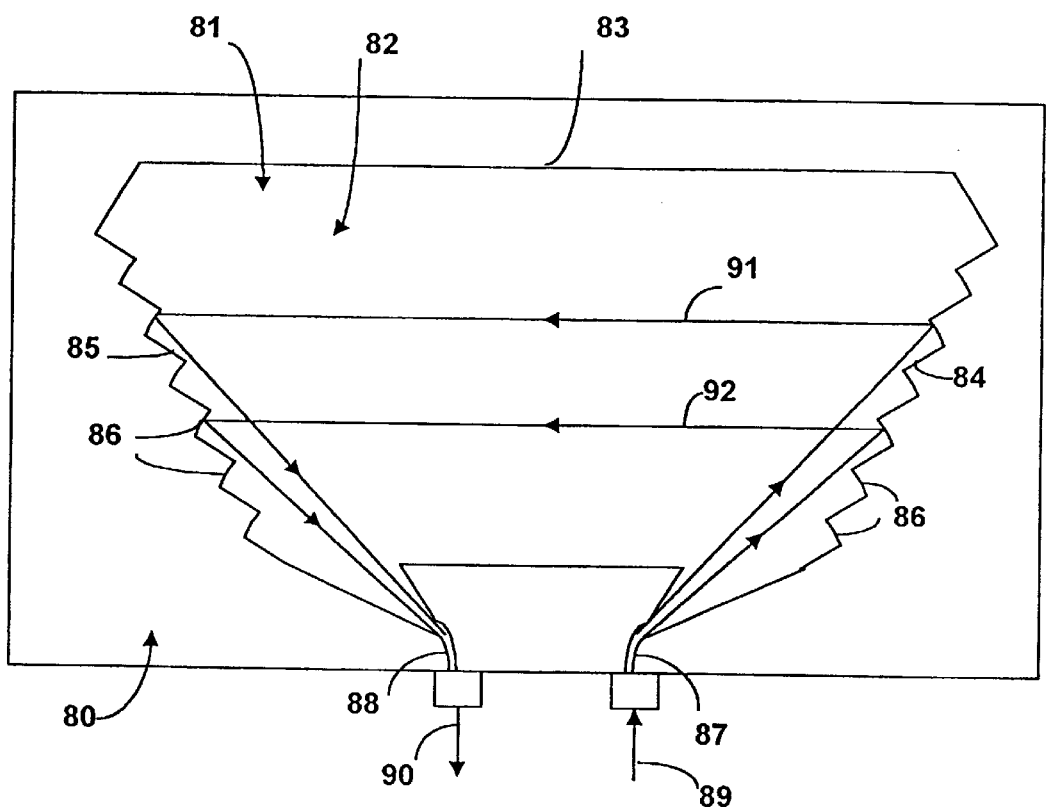
Figure 16:
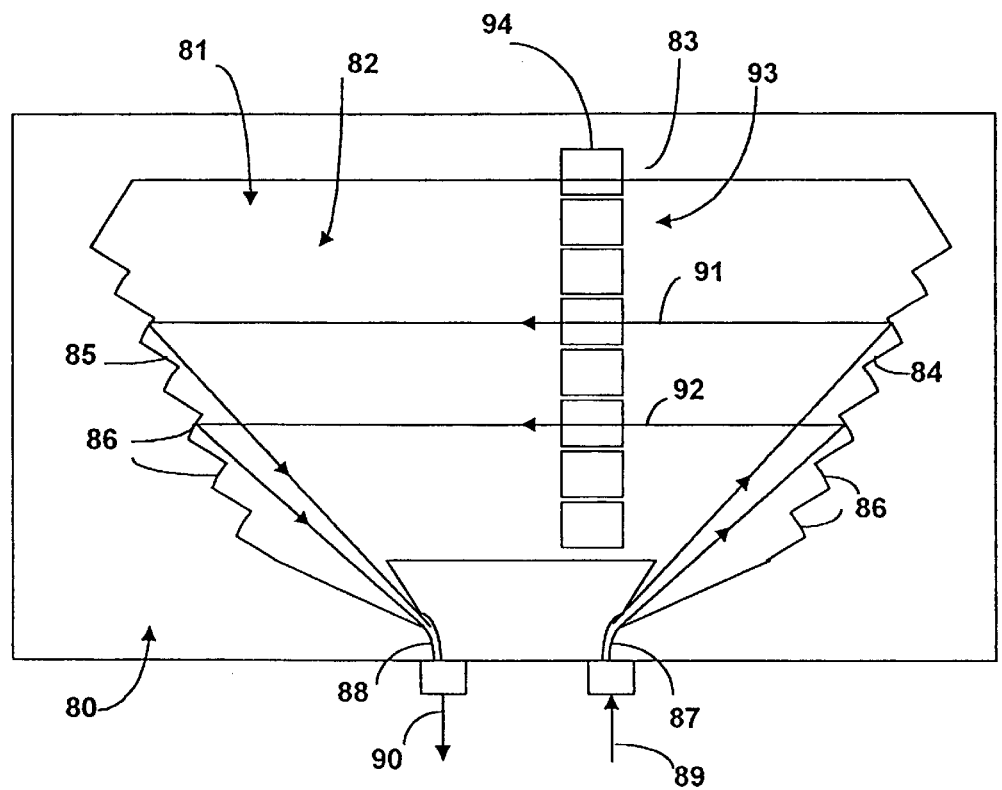
Figure 17:
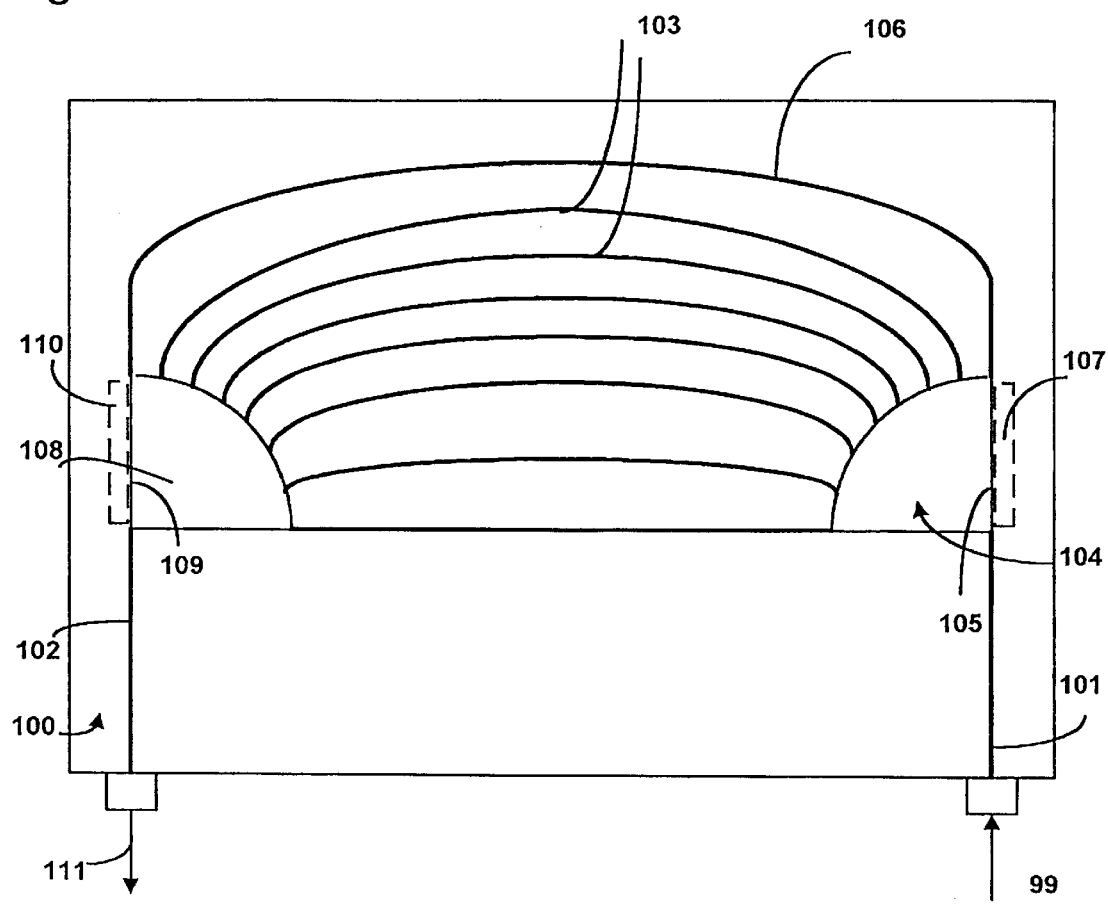

FIG. illustrates a 3 dB coupler having output from one arm variably controlled;

FIG. 10 illustrates control of transmission of a waveguide by variably controllable lattice sites located within the waveguide;

FIG. 11 illustrates a complex equalizer constructed from multiple waveguides to achieve a synthesized transfer function;

FIG. 12 is a schematic representation of the effect of multiple arm Mach-Zehnder interferometer for frequency response synthesis;

FIG. 3 is a graphical illustration of the synthesized transfer function;

FIG. 14 illustrates a line amplifier with an adaptive equalizer of the type shown in FIG. 11;

FIG. 15 illustrates an alternative device for providing a number of distinct optical pathways by reflection;

FIG. 16 illustrates a modification to the device of FIG. 15 to include respective modulation in the multiple pathways;

FIG. 16 illustrates an alternative waveguide device utilising the control of surface wave propagation; and FIG. 18 illustrates in detail the surface layer of controlled lattice sites in the device of FIG. 17.

DETAILED DESCRIPTION

Figure 1:
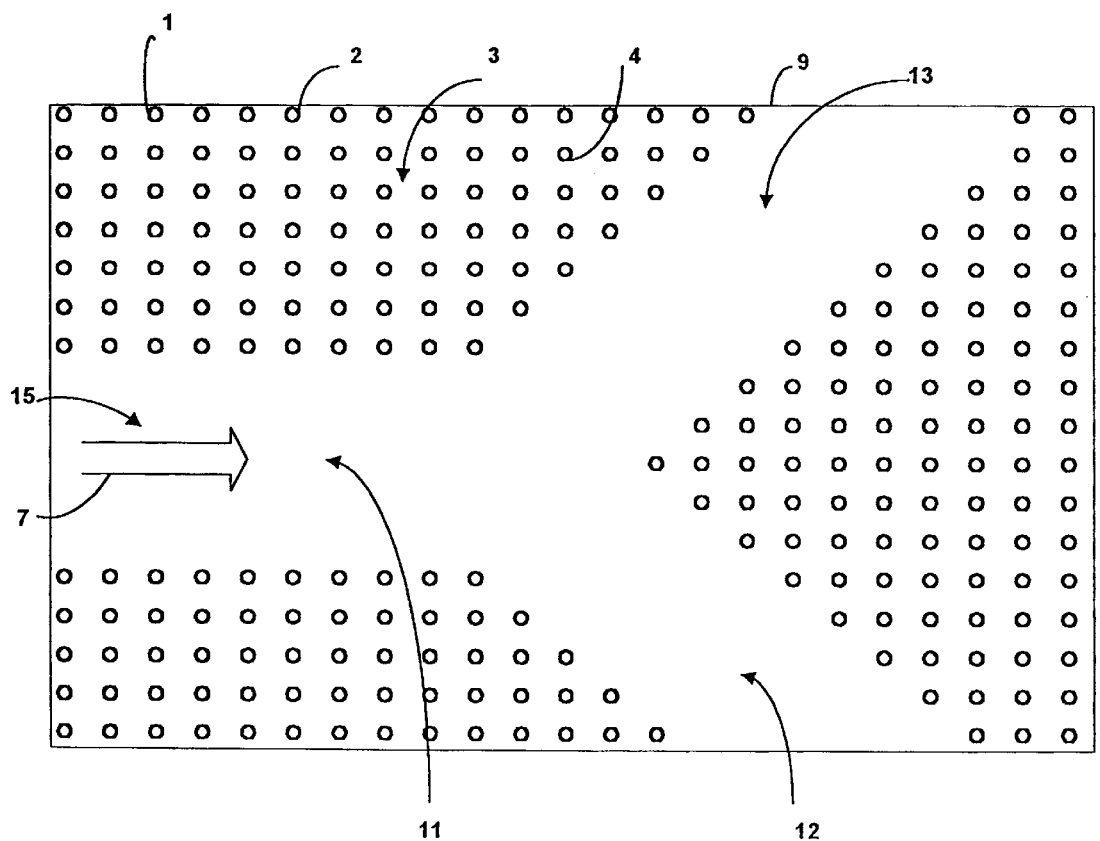
FIG. 1 is a schematic representation of a waveguide formed in a photonic crystal.

In FIG. 1, a photonic crystal 1 is formed in a slab 2 of dielectric material in which a lattice region 3 is defined by a regular array in two dimensions of lattice sites 4. The lattice sites 4 are arranged in a square lattice configuration in which each lattice site 4 comprises a cylindrical column of a second dielectric material having a lower refractive index than that of the bulk properties of the slab 2.

Figure 2:
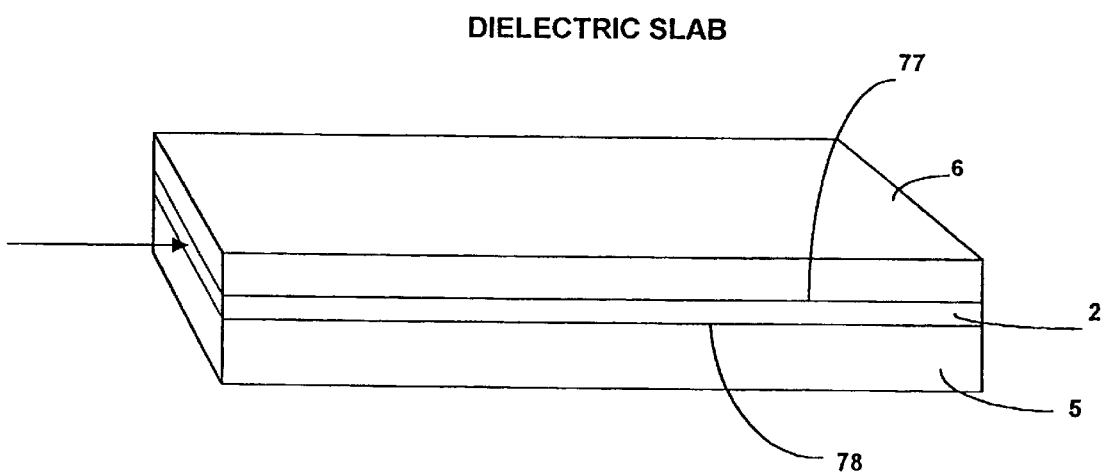
FIG. 2 illustrates a dielectric slab in which a photonic crystal is formed.

As shown in FIG. 2, the slab 2 is sandwiched between a substrate 5 and a cover layer 6 and an optical signal 7 is launched into the slab 2 in a direction which is parallel to the planar extent of the slab.

FIG. 3 illustrates the formation of the lattice sites 4 as regularly spaced columns 8 of dielectric material. In the lattice region 3, the array of lattice sites 4 is dimensioned such that a photonic band gap exists for propagation of the optical signal in directions parallel to the planar extent of the slab 2. As seen in FIG. 1, rows and columns of the lattice sites define axes which are parallel to the plane of the slab 2 and a waveguide region shown as waveguides 11, 12 and 13 in FIG. 1 is formed by an area of the slab 2 in which there are no lattice sites. Transmission of the optical signal is thereby facilitated within the waveguide region and penetrates only into the latticed region to a minimal extent as evanescent mode propagation which decays exponentially, permitted propagation modes being confined to the waveguide region.

The optical signal is confined in directions normal to the plane of the slab 2 by guidance in the form of internal reflection at surfaces 77 and 78 shown in FIG. 2 between the slab 2, the substrate 5 and the cover layer 6. The waveguides may thereby be regarded as channels through which the optical signal is confined by the presence of the surrounding band gap material.

FIG. 1 illustrates a small rectangular portion 9 of the slab 2 shown in FIG. 4 and which defines waveguides forming a simple two-arm Mach Zehnder filter. As illustrated in FIG. 4 in which, for convenience, waveguides are represented by single lines, the portion 9 of FIG. 1 corresponds to a Y junction 10 at which a first waveguide 11 branches into second and third waveguides 12 and 13. The waveguides 12 and 13 are brought into sufficiently close proximity to provide coupling at a 3 db coupler 26 and thereafter diverge. The waveguides 12 and 13 define optical path lengths of L and L+dL respectively between the junction 10 and the coupling 26.

An input optical fibre 14 is connected to the slab 2 to launch the optical signal 7 into an input region 15 defined by the first waveguide 11. Output optical fibres 16 and 17 are connected to the slab 2 to receive components of the optical signal from output regions 18 and 19 of the slab defined by the second and third waveguides respectively.

The difference in path length dL between the first and second waveguides 12 and 13 results in there being a modification to the frequency characteristics in an output optical signal 20 as illustrated in FIG. 5. The depth of modulation of signal power as a function of frequency is dependent upon the relative powers input into waveguides 12 and 13 from the Y junction 10. The location of the frequency peaks $f_x$, $f_y$, $f_z$ relative to the frequency scale, i.e. the "phase" in frequency space of the modulation, is dependent upon the value of the difference in path length dL, as is the separation between peaks in the envelope of the spectrum.

The filter provided by the Mach-Zehnder interferometer of FIG. 4 has a fixed frequency characteristic. The filter may be made adaptive by modulating transmission in the waveguides of the interferometer as illustrated in the example of FIG. 6.

Figure 7:
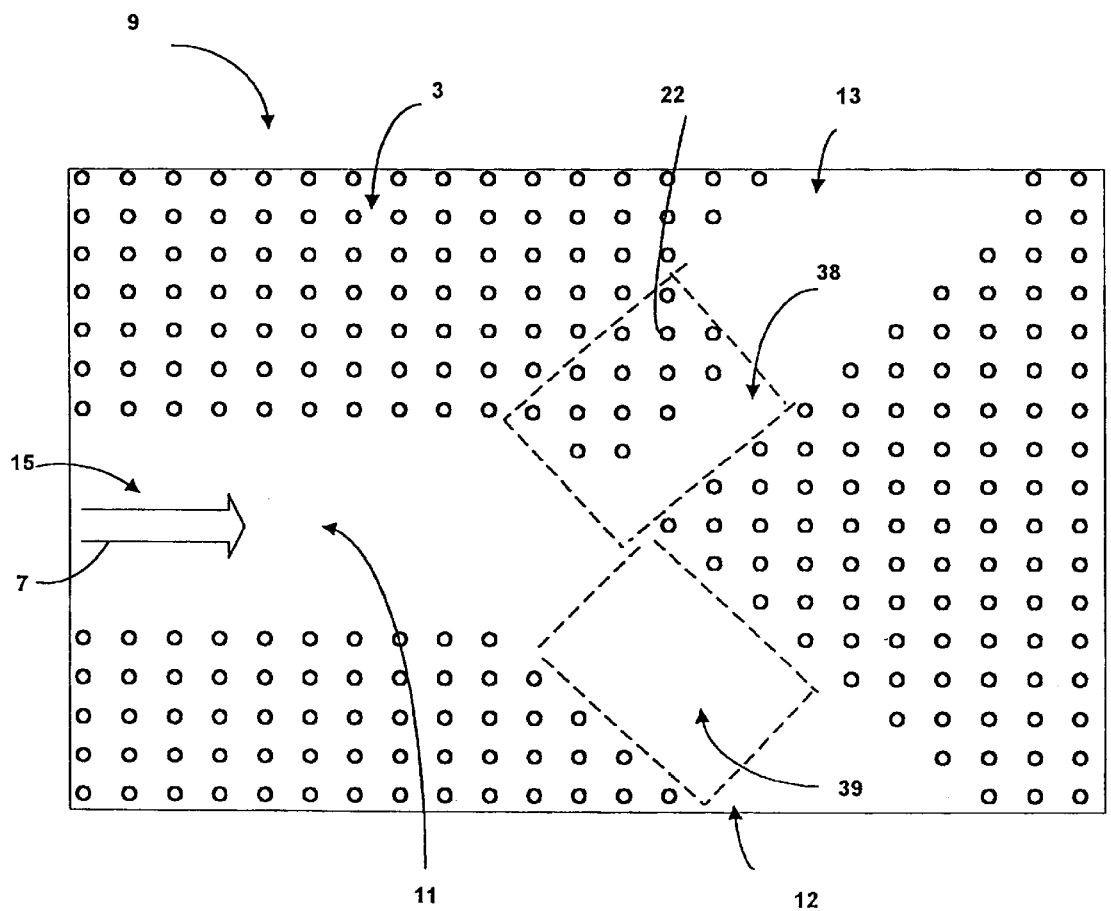
FIG. 7 illustrates the formation of a variably controllable Y junction in waveguides of a photonic crystal.

FIG. 6 illustrates a Mach-Zehnder interferometer similar to that of FIG. 4 and will be described using corresponding reference numerals for corresponding elements where appropriate. A first modulator 21 is externally controllable to vary the ratio of the input optical signal diverted into each one of the second and third waveguides 12 and 13. FIG. 7 illustrates an example of the manner in which the first modulator 21 may be implemented to vary the proportion of the optical signal diverted into arms of the Y junction 10. The third waveguide 13 is modified by the presence of controllable lattice sites 22 located in the waveguide region in areas 38 and 39 and comprising cylindrical columns formed of a ferrite material to which a variably controllable external field is applied. The locations of the controllable lattice sites conform to the column and row positions of the surrounding lattice region and in effect form an extension of the lattice. The presence of the controllable lattice sites 22 can therefore in effect be turned on or off in variable number to thereby variably control the effective apertures of the second and third waveguides 12 and 13. This is represented in FIG. 7 by showing only those controlled lattice sites 22 which are turned "on" and which in this example are located only in the third waveguide 13. The amount of optical signal coupled into the third waveguide is thereby controllable by setting the number of sites which are turned on, the remainder of the optical signal being diverted into the second waveguide 12.

Control of the controllable lattice sites 22 is effected such as to vary the dielectric constant of the material forming the cylindrical columns 8. This variation may be continuous or discrete, i.e. variable between one of a number of stepped levels.

Figure 8:
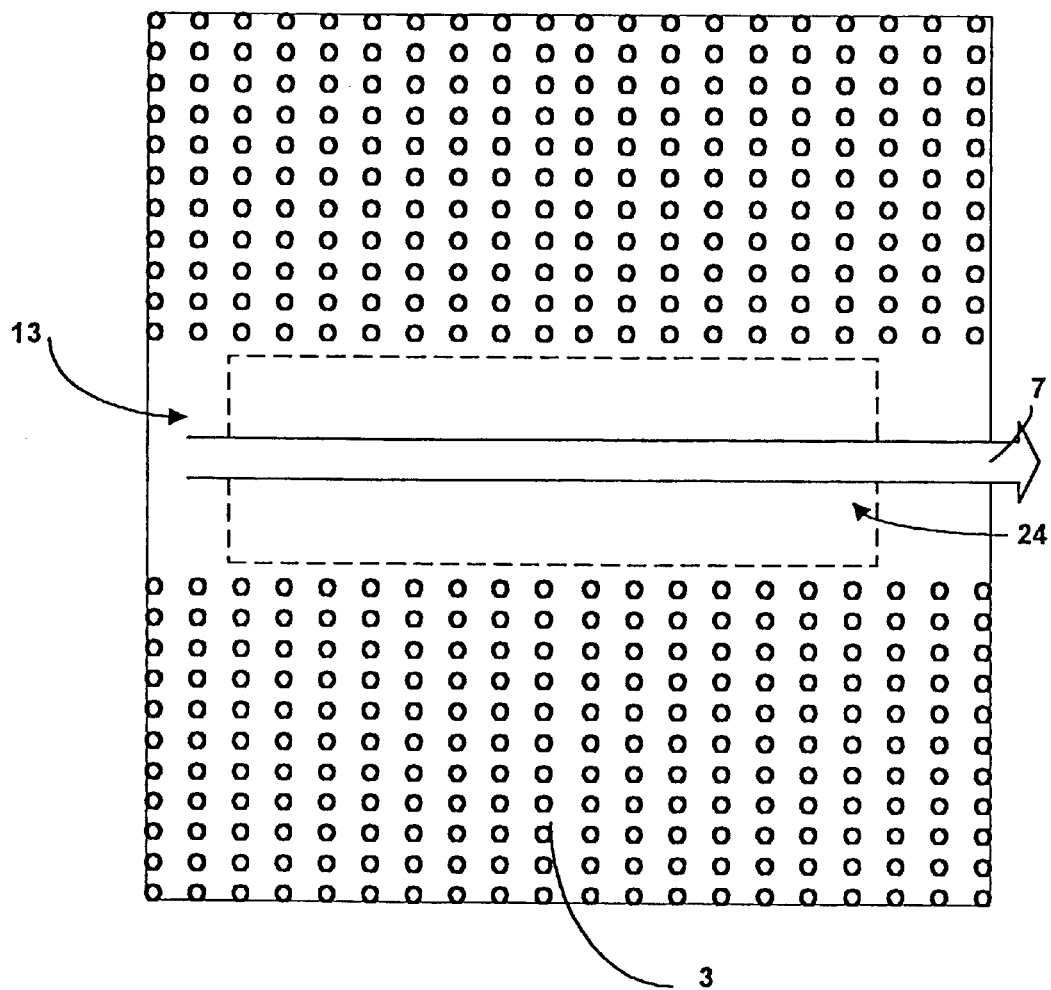
FIG. 8 illustrates a modulator for varying the optical path length in a waveguide defined in a photonic crystal.

In FIG. 6, a second modulator 23 is provided for varying the optical path length dL and is shown in greater detail in FIG. 8. A dielectric region 24 within the waveguide region defining the third waveguide 13 is subject to an externally applied control to vary the dielectric properties of the region. The externally applied control may be one of a number of available options including the application of local heating, the injection of electrical current into the semi-conductor material forming the dielectric, or other suitable optically, electromagnetically or electro-mechanically induced effects. The surrounding lattice region is substantially unaffected by this control and continues to serve as a means of confining the optical signal 7 within the waveguide so as to pass through the controlled dielectric region 24.

FIG. 9 illustrates in greater detail the construction of the 3dB coupler 26. In FIG. 9, the second and third waveguides 12 and 13 are represented in each case by pairs of parallel lines which denote the boundary between the lattice region 3 and the waveguide regions defining the waveguides and which are free of lattice sites. On each side of the waveguides 12 and 13, the extent of penetration of evanescent wave components of the optical signal in the lattice region 3 are represented as boundaries 40. The evanescent wave components decay exponentially as a function of penetration distance into the lattice region 3 and the indication of boundaries 40 should therefore be regarded only as schematic.

In FIG. 9, the boundaries 40 serve to indicate a merging of the region of lattice region 3 within which the evanescent field components of the respective waveguides 12 and 13 penetrate so that a coupling region 41 within the lattice region 3 is defined and serves as a mechanism for phase dependent transfer of energy between modes propagated through the respective waveguides.

A third modulator 25 in FIG. 6 is used to control the recombining and splitting characteristics of the coupler 26. The third modulator 25 as shown in greater detail in FIG. 10 comprises a portion 27 of the lattice extending into the waveguide region and comprised of controllable lattice sites 28 of the type referred to above with reference to FIG. 7.

By control of the lattice sites 28, the amount of optical signal output via the output optical fibre 17 is variably controllable. Light which cannot be transmitted because of the presence of the controlled lattice sites 28 is redirected to emerge from the output optical fibre 16.

The frequency characteristics of the filter constituted by the Mach-Zehnder interferometer of FIG. 6 may thereby be variably controlled using any one of, or a combination of, the first, second and third modulators 21, 23 and 25.

A more complex equalizer may be constructed from multiple waveguides as shown for example in FIG. 11 in which waveguides are, for simplicity, represented by single lines, such as waveguides 30 and 31 of substantially equal length which extend between a first star coupler 32 and second star coupler 33. The equalizer of FIG. 11 provides a multiple arm Mach-Zehnder interferometer for frequency response synthesis in which the additive effect of transmission through the arms of the waveguide array is represented in the block representation of FIG. 12. The equalizer transfer function T is synthesized by the effect of a multiple arm Mach-Zehnder interferometer to provide the transfer function shown in FIG. 13. As represented in FIG. 12, a series of delays L, L+dL, L+2dL, L+KdL are provided by delay waveguides 53 to 55 and the contribution made by each delay waveguide to the output combined by a combiner 50 is adaptively controlled by means of a set of modulators 56 where each of one the delays 53 to 55 is provided with a respective modulator. Each modulator 56 is capable of independently setting an amplitude and phase modulation to the component transmitted through the corresponding delay 53 to 55, the values of the amplitude and delay being characterized by complex coupling coefficients $C_r$, r=0 to K where there are K+1 waveguides.

The term "phase modulation" here implies a variation in optical path length resulting in a corresponding phase variation at the point of combination in combiner 50.

Figure 13:
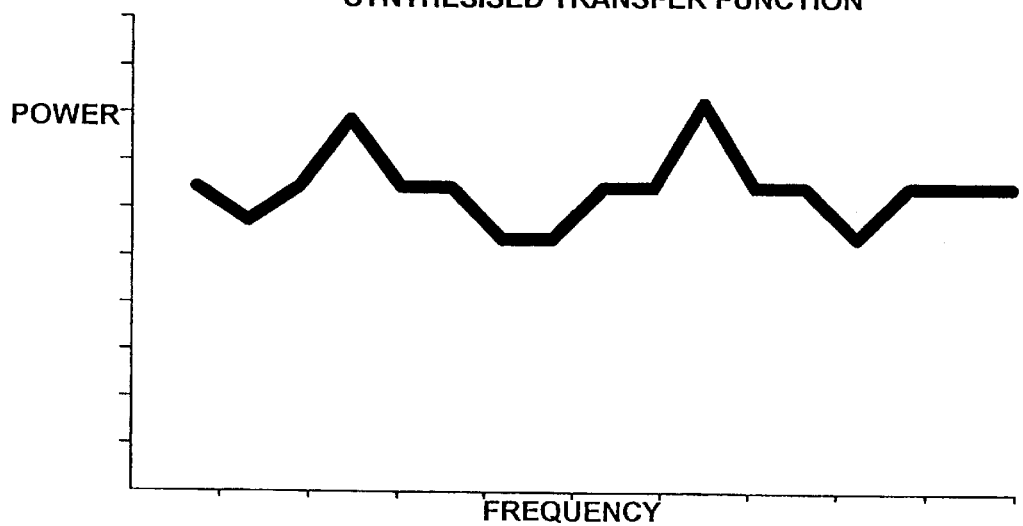

The result of the summation of the outputs from the modulated delay waveguides is illustrated schematically in FIG. 13 and has a form which is related to the values of $C_r$ by a discrete Fourier transform. The values of $C_r$ for a required transfer function may be calculated and, in the case of a wavelength division multiplexed optical signal, it is preferable to define the desired transfer function in terms of coefficients $T_n$ for N frequencies corresponding in both number and frequency value to the N wavelength channels of the input optical signal to be processed.

The arrangement of FIG. 12 may be implemented using a photonic crystal provided that the modulators 56 are capable of providing the required amplitude and phase variation. The example of FIG. 11 however makes use of a simpler form of modulation for which each one of the waveguides of FIG. 13 is replaced by a respective pair of waveguides in the array of FIG. 11. For example, in FIG. 11 the pair of waveguides 30 and 31 have respective modulators 37 and 36, each of which has the form of modulator described above with reference to FIG. 8 in which a controlled dielectric region 24 has variable dielectric properties controlled thermally or otherwise. This form of control provides adjustment to the optical path length of each of the waveguides in the array of FIG. 12, thereby effectively controlling the phase of each component. For each pair of waveguides such as 30 and 31, the phase values implemented in the modulators 36 and 37 are selected such that the combined output of these two waveguides has the required amplitude and phase corresponding to the respective one of the complex coupling coefficients $C_r$.

Alternatively, each one of the waveguides represented in FIG. 12 may be implemented as a respective group of 3 waveguides of equal lengths in the equalizer of FIG. 11, each of the group of waveguides having respective phase control modulators.

FIG. 14 illustrates the manner in which the equalizer of FIG. 11 may be used to provide equalization for a line amplifier in an optical communications system, as for example where it is necessary to compensate for the effects of gain tilt. The line amplifier consists of first and second fibre amplifiers 64 and 65, each being formed by erbium doped optical fibre amplifiers, the first fibre amplifier receiving the input optical signal 66 in the form of a wavelength division multiplexed signal having N channels separated by 100 GHz. Typically N=32. The optical signal output from the first fibre amplifier 64 is input to the adaptive equalizer 67, the output of which is input to the second fibre amplifier 65 and amplified before onward transmission in the optical system.

An optical tap 68 provides an optical sample of the optical signal input to the equalizer 67 which is detected and measured by a first detector 69 to provide measurements in the form of input channel levels $V_n$ where n=0 to 31. Similarly, a second optical tap 70 provides an optical sample of the optical signal output from the equalizer 67 which is detected and measured by a second detector 71 producing measured output channel levels $X_n$.

The equalizer 67 is adaptive in the sense of being operable to independently control transmission amplitudes of each of the wavelength division multiplexed channels, as represented by transfer function T having complex coefficients $T_n$ relating the amplitude and phase of each component output to its respective input.

These coefficients $T_n$ are target values representative of E field values arrived at by calculation and applied by calculating corresponding settings $S_m$ of variable components of the equalizer 67. An equalizer controller 72 controls the value of the equalizer settings $S_m$ applied to the variable components of the equalizer 67. The number of settings $S_m$ may be typically greater than the number N of channels and will depend upon the manner in which the equalizer is implemented. In the example of FIG. 11, each $S_m$ is the phase control of one of the waveguides and therefore the number of $S_m$ to be calculated is equal to 2×N.

The required values of the equalizer settings $S_m$ are determined by calculator 73 to enable a user to input via an input device 76 a referenced spectral characteristic $W_n$ which serves as a target value to which output channel levels $X_n$ are driven to correspond under ideal operating conditions.

The timing of operation of the first and second detectors 69 and 71 and of the equalizer controller 72 is determined by timing controller 75 which periodically outputs control signals to the first and second detectors to determine the sampling times at which $V_n$ and $X_n$ are calculated and correspondingly controls the timing at which the settings $S_m$ of the equalizer 67 are updated.

The arrangement of FIG. 14 allows the output to be monitored and its frequency characteristics measured and compared with target settings. This feedback allows a desired frequency characteristic to be achieved iteratively over a number of applications of the values of $S_m$.

FIG. 15 illustrates an alternative device for providing a number of distinct optical pathways for conducting components of the optical signal between an input region 87 and output region 88 where the number of pathways is greater than two. A latticed region 80 of photonic band gap material is formed with a waveguide region 81 which defines a cavity 82, the term cavity being used here to indicate an enclosed region of the dielectric material of the slab 2 which is free of lattice sites and therefore transmissive to the optical signal. A boundary 83 defined by the transition between latticed region 80 and waveguide region 81 is shaped to provide first and second sidewalls 84 and 85, each having a stepped profile when viewed orthogonally to the plane of the slab 2. The stepped sidewalls 84 and 85 each include a series of concave reflectors 86, defined by portions of the boundary 83, which are oriented to reflect components of the optical signal. The input region 87 of the waveguide region 81 is coupled to an optical fibre 89 via which the optical signal is input and a further optical fibre 90 is coupled to the output region 88 of the waveguide region.

The optical signal on entering the input region 87 is spread out in fan formation to illuminate the reflectors 86 of the first sidewall 84 and individual components such as 91 and 92 illustrated in FIG. 15 of the optical signal are separately reflected by respective reflectors 86 and directed onto corresponding reflectors of the second sidewall 85. Reflection of the components from the sidewall 85 converges the optical signal to be collected and output via the output region 88 and optical fibre 90.

Each of the reflectors 86 is concave to direct and concentrate the respective component onto the corresponding reflector of the second sidewall 85 and achieve convergence at the output region 88.

The device of FIG. 15 thereby provides for the input signal to be divided into a number of distinct components 91, 92 which traverse different optical pathlengths before being recombined in the output region 88. The respective path lengths remain constant and the effects of interference in the output region produce a predetermined transfer function, or in other words a set profile of equalization applied to the frequency components of the optical signal.

FIG. 16 shows an alternative device which is equivalent to the device of FIG. 15 but with the addition of an array 93 of modulators 94 located within the cavity 82 such that each modulating element 94 lies in the path of a respective component 91 of the optical signal. Controlled actuation of each of the modulator elements 94 in the array 93 provides means for modifying the transfer function of the device, for example by controlling the amplitude of each of the components. Alternatively, the modulator elements 94 may introduce controlled amounts of change in optical pathlength, thereby effectively changing the relative phase of the components before recombination, or alternatively both amplitude and phase may be variably controlled by appropriate modulator elements.

The modulator elements of FIG. 16 may be controlled in a similar manner to the method of control described above with reference to FIGS. 13 and 14 in order to achieve adaptive equalization.

The modulator elements 94 may conveniently be formed by providing controlled lattice sites of the type referred to above with reference to FIG. 7 as a means of providing amplitude modulation. Phase modulation may be provided by the external application of thermal or electromagnetic fields to the bulk material forming the slab 2 in the locality of the modulator element 94.

FIG. 17 illustrates an alternative device for achieving adaptive equalization of an optical signal and comprises a latticed region 100 formed by a regular array of lattice sites providing a photonic bandgap at optical frequencies including the frequency range of the optical signal. In FIG. 17, waveguides are represented by single lines which are bold to distinguish waveguides from other boundary features. A waveguide region formed by the omission of latticed sites is provided with an input region 101, an output region 102 and a plurality of channels defining waveguides 103 for conducting respective components of the optical signal by respectively different optical path lengths extending between the input and output regions.

The input region 101 communicates with a first coupling region 104 defined by a fan shaped portion of waveguide region which is free of lattice sites, the first coupling region having a side wall 105 extending linearly and oriented relative to the input region such that the input optical signal is incident upon the sidewall at a shallow angle of grazing incidence. A Bloch surface wave thereafter propagates along the sidewall 105 in the manner described for example by Joannopoulous, "Photonic Crystals Moulding the Flow of Light", Princeton University, 1995, at page 73 to 77. Such surface modes in the case of a perfectly formed sidewall 105 of regular lattice sites will guide the optical signal close to the sidewall to enter a waveguide 106 located at the end of the sidewall.

An array of controlled lattice sites 107 is distributed along the sidewall 105 and includes lattice sites which are selectively activated to perturb the surface wave and cause deflection of components of the optical signal away from the sidewall into the first coupling region 104 so as to enter selectively ones of the waveguides 103. In this manner, the proportion of the optical signal diverted into each of the waveguides 103 is controlled.

Similarly, the outputs of the waveguides 103 communicate with a second coupling region 108 in which the waveguide 106 enters relative to a second sidewall 109 at a shallow angle of grazing incidence, thereby confining the component conducted by waveguide 103 to a surface wave communicating with the output region 102.

A further array of controlled lattice sites 110 is provided along the boundary between latticed region 100 and waveguide region at the sidewall 109 to selectively divert a proportion of the optical signal component received from the waveguide 106. The outputs of the remaining waveguides 103 enter the second coupling region 108 and converge on the output region 102 so as to be collected and emerge via an output optical fibre 111.

Equalization may thereby be adaptively applied to an optical signal entering the device via input optical fibre 99 and exiting via output optical fibre ill, the control mechanism for determining the control parameters applied to the arrays 107 and 110 of controlled latticed sites corresponding generally to the arrangement described above with reference to FIGS. 13 and 14.

FIG. 18 shows schematically the propagation of a surface wave 112 parallel to the boundary between lattice region 100 and the coupling region 108. A surface layer 113 of controlled lattice sites 114 allows selected sites to be varied in dielectric properties so as to create discontinuities in the surface layer, thereby achieving selectively a controlled amount of scattering of the optical signals in directions indicated by arrows 115.

By appropriate control, the amount of light scattered into each of the waveguides 103 may thereby be variably controlled.

In the above described embodiments, the band gap is formed by a two dimensional array of lattice sites in which the array is of square configuration. Other forms of array may be utilised such as a triangular array or honeycomb shaped array. Alternatively, the array may be three dimensional.

In the above described embodiments, multiple waveguides have been disclosed in arrays which have discrete non-overlapping paths. More complex devices are envisaged in which overlapping meshed paths are utilised in order to achieve more complex relationships between division and recombination of components of the optical signal. The path lengths described in the above embodiments include linearly increasing length differentials, i.e. multiples of dL. More generally, embodiments are envisaged in which non-linear progressions of path lengths are utilised, such as chirped systems where the differential lengths follow a squared, cubic or exponential progression. Gapped or staggered sequences of increasing path length may also be utilised.

In the above described embodiments, the input region and output region are physically separated. It is however envisaged that devices and methods in accordance with the present invention may utilise input and output of optical signals from the same region, as in the case of a Michelson interferometer configuration, and in such instances it is intended that the terms input region and output region may simultaneously apply to the same region.

It is also noted that in many embodiments of the present invention the path taken by optical signals may be reversed, or simultaneously propagated in opposite directions, so that the terms input and output are interchangeable in this context.

I claim:

1. A waveguide device for an optical signal comprising;
   a slab of dielectric medium;
   a latticed region formed in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough; and
   a waveguide region formed in the dielectric medium by discontinuities in the periodic array of lattice sites allowing propagation of the signal therethrough;
   wherein the waveguide region defines an input region for the input of the optical signal, an output region for the output of the optical signal and a plurality of optical pathways for conducting respective components of the optical signal between the input and output regions;
   wherein the waveguide region defines a cavity bounded by a boundary surface at the transition between the latticed region and the waveguide region, the cavity communicating with the input region and the output region; and
   wherein the boundary surface constitutes a plurality of reflectors directing respective components of the optical signal via said respective optical pathways between the input region and the output region.

2. A device as claimed in claim 1 further comprising modulating means operable to modulate transmission of at least one of the components of the optical signal within the cavity.

3. A device as claimed in claim 2 wherein the modulating means comprises an array of modulating elements located in the cavity, each element being operable to modulate a respective component of the optical signal.

4. A device as claimed in claim 3 wherein the modulating elements comprise controlled latticed sites.

5. A waveguide device for an optical signal comprising;
   a slab of dielectric medium;
   a latticed region formed in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough; and
   a waveguide region formed in the dielectric medium by discontinuities in the periodic array of lattice sites allowing propagation of the signal therethrough;
   wherein the waveguide region defines an input region for the input of the optical signal, an output region for the output of the optical signal and a plurality of optical pathways for conducting respective components of the optical signal between the input and output regions; and
   comprising modulating means operable to variably control transmission through a plurality of the optical pathways to adaptively define a transfer function of equalization applied to frequency components of the optical signal.

6. A device as claimed in claim 5 comprising control means for controlling the modulating means and operable to determine modulation parameters to be applied by the modulating means in response to input of data defining a desired transfer function for the applied equalization, wherein the modulation means is operable to modulate transmission of components of the optical signal via respective pathways in dependence upon values of respective modulation parameters.

7. A device as claimed in claim 6 further comprising measurement means operable to measure the spectrum of the optical signal output from the output region and wherein the control means is operable to determine the modulation parameters in accordance with the measured spectrum and the input data.

8. A waveguide device for an optical signal comprising;
   a slab of dielectric medium;
   a latticed region formed in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough; and
   a waveguide region formed in the dielectric medium by discontinuities in the periodic array of lattice sites allowing propagation of the signal therethrough;
   wherein the waveguide region defines an input region for the input of the optical signal, an output region for the output of the optical signal and a plurality of optical pathways for conducting respective components of the optical signal between the input and output regions;
   wherein the waveguide region defines a cavity bounded by a boundary surface at the transition between the latticed region and the waveguide region and a plurality of waveguides communicating with the cavity at different locations on the boundary surface, the cavity being formed with a linearly extending portion of the boundary surface; and
   wherein the waveguide region further defines an input waveguide communicating with the cavity and positioned to direct the optical signal into grazing incidence with the linearly extending portion for creating surface wave propagation of the optical signal propagating in proximity with the linearly extending portion.

9. A device as claimed in claim 8 comprising modulating means operable to modulate properties of localised structures constituting the linearly extending portion of the boundary surface to variably control proportions of the optical signal deflected from surface wave propagation into the respective waveguides communicating with the cavity.

10. A method of applying equalization to an optical signal comprising the steps of;

inputting the optical signal to an input region of a waveguide device;

conducting components of the optical signal to an output region of the waveguide device via a plurality of respective optical pathways defined by the waveguide device; and outputting the optical signal from the output region;

wherein the step of conducting the components of the optical signal comprises inhibiting propagation of the optical signal through a latticed region formed by a periodic array of lattice sties defining a photonic band-gap and propagating the components of the optical signal via a waveguide region formed by discontinuities in the periodic array of lattice sites;

wherein the waveguide region defines a cavity bounded by a boundary surface at the transition between the latticed region and the waveguide region, the cavity communicating with the input region and the output region; and wherein the boundary surface constitutes a plurality of reflectors directing respective components of the optical signal via respective pathways between the input region and the output region.

11. A method as claimed in claim 10 further comprising the step of modulating transmission of at least one of the components of the optical signal within the cavity.

12. A method as claimed in claim 11 wherein the modulating step comprises operating an array of modulating elements located in the cavity, each element modulating a respective component of the optical signal.

13. A method as claimed in claim 12 wherein the modulating elements comprise controlled latticed sites.

14. A method of applying equalization to an optical signal comprising the steps of;

inputting the optical signal to an input region of a waveguide device;

conducting components of the optical signal to an output region of the waveguide device via a plurality of respective optical pathways defined by the waveguide device;

modulating transmission through at least one of the optical pathways to thereby modulate a respective component of the optical signal; and outputting the optical signal from the output region;

wherein the step of conducting the components of the optical signal comprises inhibiting propagation of the optical signal through a latticed region formed by a periodic array of lattice sties defining a photonic band-gap and propagating the components of the optical signal via a waveguide region formed by discontinuities in the periodic array of lattice sites; and wherein the modulating step comprises variably controlling transmission through a plurality of the optical pathways to adaptively define a transfer function of equalization applied to frequency components of the optical signal.

15. A method as claimed in claim 14 comprising a controlling step of determining modulation parameters to be applied in the modulating step in response to input of data defining a desired transfer function for the applied equalization, wherein the modulation step modulates transmission of components of the optical signal via respective pathways in dependence upon values of respective modulation parameters.

16. A method as claimed in claim 15 further comprising the step of measuring the spectrum of the optical signal output from the output region and wherein the controlling step determines the modulation parameters in accordance with the measured spectrum and the input data.

17. A method of dividing an optical signal into a plurality of components for conduction via respective waveguides comprising the steps of:

inputting the optical signal into a waveguide region defined by discontinuities in a latticed region in which propagation is inhibited by a photonic band gap;

directing the optical signal into grazing incidence with a linearly extending surface defined by a transition between the latticed region and the waveguide region so that surface wave propagation of the optical signal occurs in proximity with the linearly extending surface;

deflecting portions of the surface wave by scattering from the linearly extending surface; and conducting the deflected portions into said waveguides.

18. A method as claimed in claim 17 including the step of modulating properties of localised structures defining lattice sites in the latticed region at the transition defining the linearly extending surface, and controlling said modulation so as to variably control the proportions of said optical signal deflected into the respective waveguides.

19. An optical communications system comprising at least one waveguide device for an optical signal, said at least one waveguide device comprising:

a slab of dielectric medium;

a latticed region formed in the dielectric medium by a periodic array of lattice sites comprising localised structures having dielectric properties which are different from those of the surrounding medium, the periodic array being dimensioned such that a photonic bandgap exists in the latticed region inhibiting propagation of the optical signal therethrough;

a waveguide region formed in the dielectric medium by discontinuities in the periodic array of lattice sites allowing propagation of the signal therethrough; and a line amplifier operable to amplify said optical signal;

wherein the waveguide region defines an input region for the input of the optical signal, and output region for the output of the optical signal and a plurality of optical pathways for conducting respective components of the optical signal between the input and output regions; and wherein said waveguide device constitutes a component of said line amplifier.

20. An optical communication system as claimed in claim 19 wherein said waveguide device is operable to correct gain tilt in said line amplifier.

* * * * *